(12) United States Patent
Goerlach

(10) Patent No.: US 10,050,140 B2
(45) Date of Patent: Aug. 14, 2018

(54) RECTIFIER DIODE

(71) Applicant: Robert Bosch GmbH, Stuttgart (DE)

(72) Inventor: Alfred Goerlach, Kusterdingen (DE)

(73) Assignee: ROBERT BOSCH GMBH, Stuttgart (DE)

( * ) Notice: Subject to any disclaimer, the term of this patent is extended or adjusted under 35 U.S.C. 154(b) by 0 days.

(21) Appl. No.: 14/776,455

(22) PCT Filed: Feb. 25, 2014

(86) PCT No.: PCT/EP2014/053596
§ 371 (c)(1),
(2) Date: Sep. 14, 2015

(87) PCT Pub. No.: WO2014/146870
PCT Pub. Date: Sep. 25, 2014

(65) Prior Publication Data
US 2016/0056284 A1     Feb. 25, 2016

(30) Foreign Application Priority Data
Mar. 18, 2013   (DE) .................. 10 2013 204 701

(51) Int. Cl.
*H01L 29/66* (2006.01)
*H01L 29/78* (2006.01)
(Continued)

(52) U.S. Cl.
CPC ...... *H01L 29/7827* (2013.01); *H01L 29/0626* (2013.01); *H01L 29/0696* (2013.01);
(Continued)

(58) Field of Classification Search
CPC . H01L 29/872; H01L 29/861; H01L 29/0619; H01L 29/0634; H01L 29/7813;
(Continued)

(56) References Cited

U.S. PATENT DOCUMENTS

| 5,804,851 A * | 9/1998 | Noguchi ............... H01L 27/108 257/296 |
| 5,818,084 A | 10/1998 | Williams et al. |
| 7,615,812 B1 | 11/2009 | Metzler et al. |
| 7,719,080 B2 * | 5/2010 | Zhang ................. H01L 29/0692 257/213 |
| 7,781,869 B2 * | 8/2010 | Inoue .................... H01L 29/861 257/476 |
| 2002/0030237 A1 | 3/2002 | Omura et al. |
| 2004/0084721 A1 | 5/2004 | Kocon et al. |
| 2006/0065924 A1 * | 3/2006 | Yilmaz ............... H01L 29/0619 257/328 |
| 2008/0009109 A1 * | 1/2008 | Greene .................. H01L 21/22 438/173 |

(Continued)

FOREIGN PATENT DOCUMENTS

| DE | 195 49 202 | 7/1997 |
| DE | 10 2004 053760 | 5/2006 |

(Continued)

OTHER PUBLICATIONS

International Search Report for PCT/EP2014/053569 dated May 14, 2014.

*Primary Examiner* — David Chen
(74) *Attorney, Agent, or Firm* — Norton Rose Fulbright US LLP; Gerard Messina

(57) ABSTRACT

A pseudo-Schottky diode has an n-channel trench MOSFET which includes: a cathode, an anode, and located between the cathode and the anode, the following elements: a highly $n^+$-doped silicon substrate; an n-doped epilayer having a trench extending into the n-doped epilayer from above; p-doped body regions provided above the n-doped epilayer and between the trenches. Highly $n^+$-doped regions and highly $p^+$-doped regions are provided on the upper surface of the p-doped body regions. Dielectric layers are provided on the side walls of the trench. The trench is filled with a first p-doped polysilicon layer, and the bottom of the trench is formed by a second p-doped layer which is in contact with the first p-doped polysilicon layer, and the second p-doped layer determines the breakdown voltage of the pseudo-Schottky diode.

21 Claims, 3 Drawing Sheets

(51) Int. Cl.
  *H01L 29/861* (2006.01)
  *H01L 29/06* (2006.01)
  *H01L 29/423* (2006.01)
  *H01L 29/49* (2006.01)
  *H01L 29/872* (2006.01)

(52) U.S. Cl.
  CPC .... *H01L 29/4236* (2013.01); *H01L 29/42368* (2013.01); *H01L 29/4916* (2013.01); *H01L 29/861* (2013.01); H01L 29/7813 (2013.01); H01L 29/872 (2013.01); H01L 29/8725 (2013.01)

(58) Field of Classification Search
  CPC ............ H01L 29/407; H01L 29/66734; H01L 29/7802; H01L 29/8725
  USPC ........ 257/328, 329, 330, 471, 481, E21.359, 257/E29.257, E29.327, E29.338
  See application file for complete search history.

(56) References Cited

U.S. PATENT DOCUMENTS

2009/0218621 A1* 9/2009 Pfirsch ................ H01L 29/0634
                                                                257/342
2009/0315083 A1   12/2009 Pan et al.
2013/0221368 A1*  8/2013 Oraw ..................... H01L 27/15
                                                                257/76

FOREIGN PATENT DOCUMENTS

DE   10 2004 056 663   6/2006
DE   10 2010 062 677   6/2012

* cited by examiner

US 10,050,140 B2

RECTIFIER DIODE

BACKGROUND OF THE INVENTION

1. Field of the Invention

The present invention relates to a pseudo-Schottky diode that has an n-channel trench MOSFET.

2. Description of the Related Art

In three-phase or alternating-current generators for motor vehicles (alternators), alternating-current bridges (rectifiers) are used for power rectification. Usually semiconductor diodes having a p-n junction made of silicon are used as rectifying elements. In a three-phase generator, for example, six semiconductor diodes are interconnected to form a B6 bridge. Occasionally, diodes are also connected in parallel and twelve instead of six diodes are used, for example. In alternating-current generators having a different phase number, suitably adapted diode bridges are used.

The diodes are designed for operation at high currents or current densities of up to more than 500 A/cm$^2$ and high temperatures or a maximum barrier layer temperature Tj of approximately 225° C. At the high currents used, the voltage drop in the forward direction, i.e. the forward voltage UF, is typically approximately 1 volt. In operation in the blocking direction below breakdown voltage UZ, normally only a very small reverse current IR flows. From breakdown voltage UZ onward, the reverse current rises sharply. A further voltage rise is therefore prevented. In this context, Z diodes are used having reverse voltages of approximately 20-40 volts, depending on the system voltage of the respective motor vehicle. In the breakdown, Z diodes may be loaded briefly with high currents. For this reason, they are used to limit the overshooting generator voltage during load changes. Such diodes are usually packaged in robust press-fit diode housings, as is described for example in published German patent document DE 195 49 202 B4.

The forward voltage of p-n diodes results in forward power losses and thus in an efficiency degradation of the generator. Since in the current delivery of the generator on average two diodes are always connected in series, the average forward power losses in a 100 A generator amount to approximately 200 W. These losses result in a temperature rise in the diodes. The arising heat must be dissipated by elaborate cooling measures on the rectifier, for example by using heat sinks and/or a fan.

To reduce the forward power losses, published German patent application document DE 10 2004 056 663 A1 provides for the use of so-called high-efficiency Schottky diodes (HED) instead of p-n diodes. High-efficiency Schottky diodes are diodes in which, in contrast to conventional Schottky diodes, the reverse current is nearly independent of the reverse voltage. High-efficiency Schottky diodes are made up of a combination of a conventional Schottky diode (SBD) and additional elements such as magnetoresistors, p-n junctions or different barrier metals, the combination being monolithically integrated on a semiconductor chip. High-efficiency Schottky diodes are frequently implemented in trench technology. In addition to the low forward voltage in the forward state, they also limit the overshooting generator voltage, which may occur in sudden load changes, to non-critical values, in 14 V systems typically to voltages below 30 V.

Using high-efficiency Schottky diodes, it is possible to realize substantially lower forward voltages UF in the range of 0.5 V to 0.7 V. The low forward power losses of the diodes increase the efficiency and the power output of the generator. As a consequence of the lower blocking-state power losses, it is additionally possible to reduce significantly the expenditure for cooling as compared to the use of p-n diodes.

A manufacture of high-efficiency Schottky diodes is expensive and technologically very demanding. In addition to very fine trench structures with measured widths in the range below 500 nm, which must be etched into the silicon, particularly the cost-effective manufacture of suitable and stable Schottky contacts represents a challenge. Nickel silicides or other suitable silicides are preferably used as Schottky contacts. In modern semiconductor manufacturing plants, which produce performance MOSFETs, these silicide processes are usually not available.

Published German patent application document DE 10 2010 062 677 A1 provides for the use of so-called pseudo-Schottky diodes (PSD) instead of high-efficiency Schottky diodes. These are specially manufactured n-channel MOSFETS having an extremely low threshold voltage Vth, in which gate, body and source regions are electrically fixedly connected to one another and act as an anode, while the drain region functions as a cathode. For the use of pseudo-Schottky diodes, like the use of high-efficiency Schottky diodes, allows for the implementation of low forward voltages and a voltage limitation. The voltage limitation in this instance occurs with the aid of the built-in body diode. Such components are known, for example, from U.S. Pat. No. 5,818,084. These semiconductor components contain no Schottky contacts and therefore require no special silicide processes. They may be produced using modified standard processes for MOSFETs. As majority carrier components, they in turn switch very quickly.

Pseudo-Schottky diodes are manufactured in planar power semiconductor MOSFET technology. The avalanche breakdown occurs at a voltage UZ in the interior of the semiconductor on the so-called body diode D. In the avalanche breakdown or reverse voltage breakdown, hot charge carriers (electrons and holes) are generated. The electrons flow to the cathode while the holes flow directly via the body region to the anode. The special construction of the planar MOSFETs ensures that no hot holes are injected into the gate oxide in the process, but that rather they flow off directly via the body region. The component may be operated during a load dump in the breakdown and thus limit a voltage rise without its gate oxide being modified or without the component being damaged.

In pseudo-Schottky diodes having the considered reverse voltage range, the voltage in the forward direction, the forward voltage UON, essentially drops off in the channel region (inversion channel). In order to achieve forward voltages that are as low as possible, the channel width or the number of channels in relation to the utilized chip area should therefore be selected to be as great as possible.

Fundamentally, the cell density and thus the channel width may be increased markedly if power MOSFETs, which are produced in trench technology (trench MOSFETs), are used instead of planar power MOSFETs. In these components, however, the avalanche breakdown occurs preferably on the bottom of the trench structure. The disadvantage in this regard is that the holes that are produced in the avalanche breakdown are accelerated by the electric field and are injected into the gate oxide. There they act like positive charges fixedly built into the gate oxide. This changes the properties of the trench MOS field-effect transistors. The threshold voltage VTH is lowered, for example, while the reverse voltage is increased. The variation has particularly disadvantageous effects in trench MOS transistors that have a very low threshold voltage. For this reason, pseudo-Schottky diodes, which are based on trench MOS concepts, are not suitable for voltage limitation.

Another disadvantage both in planar as well as in trench concepts is the known fact that the hole current generated by the avalanche effect generates a voltage drop on its way to the source contact and may thereby turn on the npn transistor formed by the source region, body region and n epilayer. The result is an abrupt reset of the breakdown voltage (snap back), which may result in a destruction of the transistor. This effect is particularly pronounced at high temperatures and high breakdown currents.

BRIEF SUMMARY OF THE INVENTION

A pseudo-Schottky diode according to the present invention is characterized by that fact that it has a very low voltage drop in the forward direction UON and nevertheless may be operated in a stable fashion in reverse voltage breakdown. Pseudo-Schottky diodes according to the present invention may be used as power semiconductors packaged in press-fit diode housings for rectification in motor vehicle alternating-current generators.

DETAILED DESCRIPTION OF THE INVENTION

Figure 1:
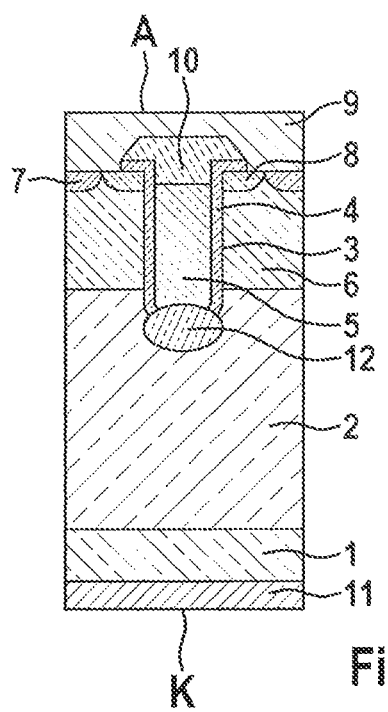
FIG. 1 shows a cross section of a first exemplary embodiment of a pseudo-Schottky diode according to the present invention.

FIG. 1 shows a cross section of a first exemplary embodiment of a pseudo-Schottky diode according to the present invention. On a highly n+-doped silicon substrate 1, an n-doped silicon layer 2 (epilayer) is situated, into which a plurality of trenches 3 are introduced. FIG. 1 shows only one of these trenches by way of example. The cells formed in the process may be island-shaped or strip-shaped or have a different kind of shape. On each of the side walls of the trenches 3 etched into the silicon there is an extremely thin dielectric layer 4, preferably made of silicon dioxide. In contrast to conventional trench MOSFETs, in which this oxide thickness is approximately 40-100 nm, the oxide thickness in a pseudo-Schottky diode according to the present invention is substantially less and is preferably in the range of 5 nm to 30 nm. Oxide layer 4 is removed or opened on the bottoms of trenches 3. The interior of the trenches is filled with a conductive material 5, for example with p-doped polysilicon. Below the p-doped polysilicon layer 5 on the trench bottom there is in each case another p-doped silicon layer 12. This layer is electrically connected to p-doped polysilicon layer 5 and together with n-doped epilayer 2 forms a p-n junction 12-2. The doping and penetration depth of this additional p-doped layer 12 is chosen in such a way that the breakdown voltage of the p-n junction 12-2 is smaller than the breakdown voltage of the remaining trench structure, which is formed by layers 5, 4 and 2, and is furthermore smaller than the breakdown voltage of the body diode (p-n junction 6-2). In the p-doped layers 6 (body region or p well) located between the trenches, highly n+-doped regions 8 (source) and highly p+-doped regions 7 are introduced on the surface, which are used for ohmic connection of the body regions. The surface of the entire structure is covered by a suitable conductive layer 9, for example by aluminum or AlSiCu, which forms an ohmic contact with p+-doped and n+-doped layers 7 and 8, respectively. A thick dielectric layer 10, for example a CVD oxide layer, respectively insulates the conductive polysilicon layer 5 from metal layer 9. Polysilicon layers 5 are galvanically connected to one another and at a contact point (not shown) via metal layer 9 to highly p+-doped layers 7 and highly n+-doped layers 8. There is also a metal layer 11 on the back side of the chip. It represents the electric contact to the highly n+-doped silicon substrate 1. Metal layer 9 forms the anode contact A and metal layer 11 forms the cathode contact K of the pseudo-Schottky diode.

For metal layer 9 and the contact point (not shown), it is possible to use a aluminum alloy having copper and silicon components (AlSiCu), as is common in silicon technology, or another metal system, for example AlCu, above a thin barrier layer made of TaN or a similar material.

For packaging in press-fit diode housings, the front side and back side of the pseudo-Schottky diode are each additionally provided with a solderable layer system. For example, a usual solderable metal system (not shown), made up of a layer sequence of Cr, NiV and Ag or example, is applied on top of metal layers 9 and 11 on the front side and back side, respectively.

In the event of a high reverse voltage VKA, diode 12-2 limits the voltage on the trench bottom. The p-n junction 12-2 breaks down (avalanche breakdown). Since the holes generated in the process flow off via additional p-doped regions 12 and doped polysilicon layers 5 to the anode, no charge carrier injection into oxide layers 4 occurs. The characteristic curve of the pseudo-Schottky diode and in particular also its threshold voltage VTH remains stable. In the forward direction, only little current flows over diodes ZD (p-n junction 12-2) and D (p-n junction 6-2) because the forward voltage UON is lower in pseudo-Schottky diodes of the present invention than the forward voltage of p-n diodes. In contrast to the pseudo-Schottky diodes as are described in DE 10 2010 062 677 A1, the avalanche breakdown does not occur on body diode D, but rather on the diodes on the trench bottoms ZD.

Fundamentally, the additional p-doped regions 12 may also extend all the way into the high n+-doped substrate region 1. In that case, the p-n junction 12-1 determines the breakdown voltage.

The voltage limitation by way of the additional p-doped regions 12 may also be used in pseudo-Schottky diodes that contain additional structures for charge compensation, for example magnetoresistors, trench MOS transistors, etc.

Figure 2:
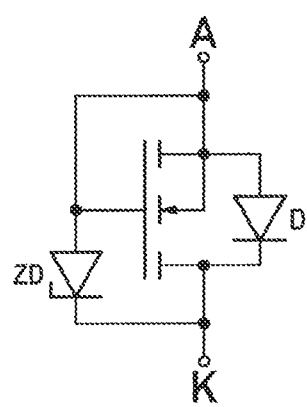
FIG. 2 shows a simple equivalent circuit diagram of a pseudo-Schottky diode.

FIG. 2 shows a simple equivalent circuit diagram of a pseudo-Schottky diode. The normally off n-channel MOSFET is connected in such a way in this instance that the gate, the body region and the source region are fixedly electrically connected to one another and act as the anode. The drain region represents the cathode.

If a positive voltage is applied to anode terminal A (forward direction), then the MOS transistor is operated in the third quadrant. Once the threshold voltage is overcome, which in pseudo-Schottky diodes is normally very low, for example 0.3 V or less, an inversion channel is formed, and current flows parallel to the integrated body diode D. Forward voltage UON is smaller than flux voltage UF of body diode D. Since the gate potential and the anode potential are identical, the MOSFET is operated at the beginning of saturation, i.e. the anode current rises approximately quadratically with flux voltage UON.

If a positive voltage is applied to cathode terminal K with respect to anode A (blocking direction), the MOSFET blocks, since its gate is at source potential. Apart from a small reverse current, the current flow is inhibited. In the event of a spiking generator voltage, as occurs in a load dump or load breaking, the voltage in a conventional pseudo-Schottky diode is limited on the basis of a planar MOSFET by body diode D. Body diode D of a planar MOSFET is used as a Z diode and limits the voltage. By contrast, the voltage in a pseudo-Schottky diode according to the present invention is limited by diode ZD on the trench bottom. In a pseudo-Schottky diode according to the present invention, the reverse voltage breakdown thus does not occur on the body diode D, but rather on diode ZD on the trench bottom. Thus it is possible to limit overvoltages in the event of a fault. If the voltage rises above the breakdown voltage UZ of the body diode, then the diode breaks down (avalanche breakdown) and thus prevents a further voltage rise. Since the generated holes flow off directly via gate polysilicon layer 5 to the anode, no harmful injection of hot charge carriers into oxide layer 4 can occur. Additionally, this prevents a switch-on of a parasitic npn transistor, formed by regions 8, 6 and 2, through the holes generated by the avalanche breakdown.

By these measures one obtains pseudo-Schottky diodes, the forward voltages of which are comparable to the forward voltages of high-efficiency Schottky diodes, but which furthermore also act as stable Z diodes.

Figure 3:
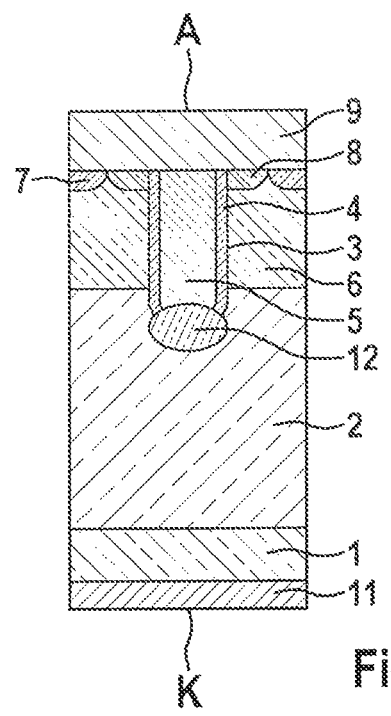
FIG. 3 shows another example embodiment of a pseudo-Schottky diode according to the present invention.

Another, simpler specific embodiment of a pseudo-Schottky diode according to the present invention is shown in FIG. 3. In contrast to the pseudo-Schottky diode shown in FIG. 1, the thick dielectric layer 10 and the contact point (not shown in FIG. 1) are eliminated. Instead, polysilicon layer 5 is connected directly to metal layer 9 and thus also to p+-doped and n+-doped layers 7 and 8.

Figure 4:
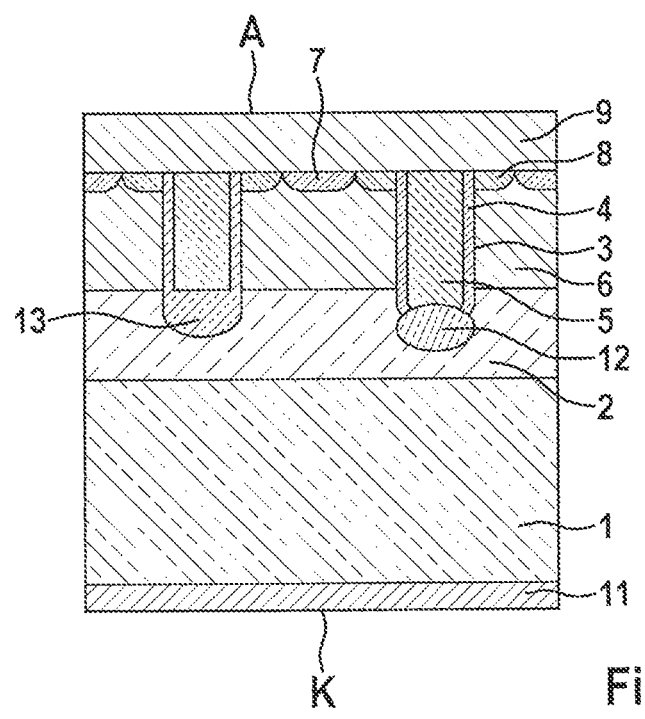
FIG. 4 shows a further exemplary embodiment of a pseudo-Schottky diode according to the present invention.
Figure 5:
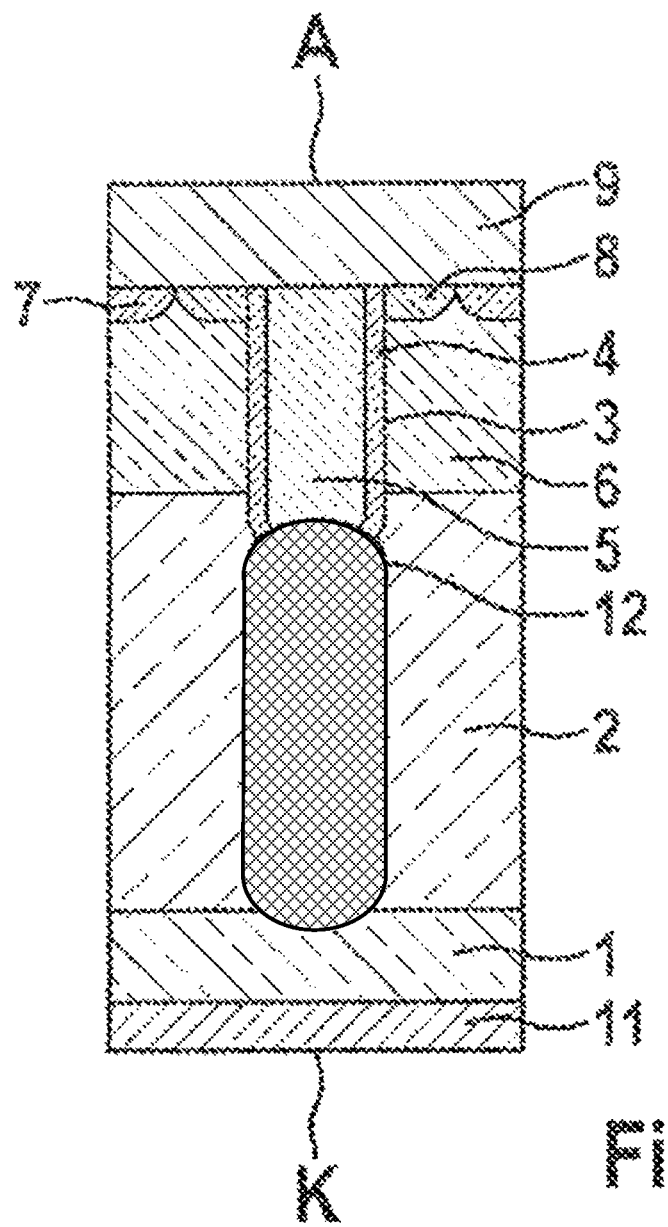

Since the additional p-doped regions 12 below the trench bottoms also diffuse out laterally somewhat, the cross section of the current flow in the forward direction is slightly reduced at this point. At high current densities, this results in an increase of forward voltage UON. As shown in a further exemplary embodiment in FIG. 4, this may be attenuated in that not every cell is provided with an additional p region 12 on the trench bottom, but for example only every second or third cell. However, on the cells that have no additional p-doped regions 12, the fields are very high on the thin gate oxide layer 4 in the region of the respective trench bottom. The thin dimensioning of gate oxide layers 4 is due to the fact that the threshold voltage of a pseudo-Schottky diode is low. This may result in damage and early failures of gate oxide layers 4. For this reason, the present invention provides for the gate oxide layers 13 provided on the trench bottoms to be thicker than the gate oxide layers 4 on the side walls of the trenches.

Pseudo-Schottky diodes having the features of the present invention may be used advantageously in motor vehicle generators as rectifier elements. Pseudo-Schottky diodes of this type are in particular also suited for use in motor vehicle alternating current generators that have more than three phases.

What is claimed is:
1. A pseudo-Schottky diode comprising:
an n-channel trench MOSFET that includes:
a drain with a cathode metal;
an anode metal; and
located between the cathode metal and the anode metal, the following elements:
a highly $n^+$-doped silicon substrate;
an n-doped epilayer having trenches extending into the n-doped epilayer from above; and
p-doped body regions provided above the n-doped epilayer and between the trenches;
wherein:
highly $n^+$-doped regions forming a source of the MOSFET and highly $p^+$-doped regions are provided on the upper surface of the p-doped body regions;
dielectric layers are provided on the side walls of the trenches;
with respect to at least one of the trenches:
a first p-doped layer, which is a polysilicon layer, forms a gate of the MOSFET, fills a first portion of the respective trench, and is electrically connected to the highly $n^+$-doped regions and the highly $p^+$-doped regions via a layer of the anode metal that extends from over the first p-doped layer to over the highly $n^+$-doped regions and the highly $p^+$-doped regions;
a second p-doped layer is:
in contact with an entirety of a bottom face of the first p-doped layer;
is at a bottom-most region of the respective trench;
extends to below a lowest point of that of the dielectric layers which is included in the respective trench; and
is in contact with at least one of the n-doped epilayer and the highly $n^+$-doped silicon substrate; and
a breakdown voltage of a junction between the second p-doped layer and the at least one of the n-doped epilayer and the highly $n^+$-doped silicon substrate (a) is lower than a breakdown voltage between the first p-doped layer and the n-doped epilayer and (b) thereby forms the breakdown voltage of the pseudo-Schottky diode; and
the gate, the body regions, and the source are monolithically and electrically connected to one another.

2. The pseudo-Schottky diode as recited in claim 1, wherein the second p-doped layer extends into the highly $n^+$-doped silicon substrate.

3. The pseudo-Schottky diode as recited in claim 1, wherein the dielectric layers provided on the side walls each have a thickness that is at least 5 nm and less than 15 nm.

4. The pseudo-Schottky diode as recited in claim 3, wherein the threshold voltage of the pseudo-Schottky diode is less than 350 mV.

5. The pseudo-Schottky diode as recited in claim 1, wherein the bottoms of the trenches are all formed by the second p-doped layer which is in contact with the first p-doped layer of respective ones of the trenches.

6. The pseudo-Schottky diode as recited in claim 1, wherein a bottom of at least another one of the trenches is formed by an oxide layer in contact with a p-doped polysilicon layer of the respective trench that fills a part of the respective trench above the oxide layer.

7. The pseudo-Schottky diode as recited in claim 1, wherein, with respect to at least another one of the trenches, a bottom and side walls of the respective trench is formed by an oxide layer that is in contact with a p-doped polysilicon layer that fills a part of the respective trench above the portion of the oxide layer that is at the bottom of the respective trench, and the oxide layer is thicker at the bottom of the respective trench than at the side walls of the respective trench.

8. The pseudo-Schottky diode as recited in claim 1, wherein the breakdown voltage of the pseudo-Schottky diode for currents in the range of 1 mA to 100 mA is between 20 V and 50 V.

9. The pseudo-Schottky diode as recited in claim 1, wherein the cutoff voltage of the pseudo-Schottky diode is less than 0.8 V for a current flow at a current density of 500 A/cm$^2$.

10. The pseudo-Schottky diode as recited in claim 9, wherein the cutoff voltage of the pseudo-Schottky diode is between 0.5 V and 0.7 V for a current flow at a current density of 500 A/cm$^2$.

11. The pseudo-Schottky diode as recited in claim 1, wherein the pseudo-Schottky diode has a solderable front side and a solderable back side.

12. The pseudo-Schottky diode as recited in claim 1, wherein the pseudo-Schottky diode is a component of a motor vehicle generator.

13. The pseudo-Schottky diode as recited in claim 1, wherein the pseudo-Schottky diode is a component of a motor vehicle alternating current generator having more than three phases.

14. The pseudo-Schottky diode as recited in claim 1, wherein the second p-doped layer is arranged such that, if a high reverse voltage, that is above the breakdown voltage of the pseudo-Schottky diode, occurs:
   the junction between the second p-doped layer and the at least one of the n-doped epilayer and the highly n$^+$-doped silicon substrate breaks down; and
   no charge carrier injection can occur into the first p-doped layer without passing into the second p-doped layer.

15. The pseudo-Schottky diode as recited in claim 1, wherein the second p-doped layer is arranged such that, if a high reverse voltage, that is above the breakdown voltage of the pseudo-Schottky diode, occurs:
   the junction between the second p-doped layer and the at least one of the n-doped epilayer and the highly n$^+$-doped silicon substrate breaks down;
   no resulting charge carrier injection can occur into the first p-doped layer without passing into the second p-doped layer; and
   no resulting charge carrier injection can occur through any dielectric layer in the at least one trench.

16. The pseudo-Schottky diode as recited in claim 1, wherein the dielectric layers provided on the side walls each has a thickness of 5 nm 30 nm.

17. A circuit comprising:
   a load; and
   a pseudo-Schottky diode that includes an n-channel trench MOSFET, the n-channel trench MOSFET including:
      a drain, which is a cathode;
      an anode; and
      located between the cathode and the anode, the following elements:
         a highly n$^+$-doped silicon substrate;
         an n-doped epilayer having trenches extending into the n-doped epilayer from above; and
         p-doped body regions provided above the n-doped epilayer and between the trenches;
   wherein:
      highly n$^+$-doped regions forming a source of the MOSFET and highly p$^+$-doped regions are provided on the upper surface of the p-doped body regions;
      dielectric layers are provided on the side walls of the trenches;
      with respect to at least one of the trenches:
         a first p-doped layer, which is a polysilicon layer, forms a gate and fills a first portion of the respective trench and is electrically connected to the highly n$^+$-doped regions and the highly p$^+$-doped regions via a layer of the anode that extends from over the first p-doped layer to over the highly n$^+$-doped regions and the highly p$^+$-doped regions;
         a second p-doped layer that:
            is in contact with an entirety of a bottom face of the first p-doped layer;
            is at a bottom-most region of the respective trench;
            extends to below a lowest point of that of the dielectric layers which is included in the respective trench; and
            is in contact with at least one of the n-doped epilayer and the highly n$^+$-doped silicon substrate; and
         a breakdown voltage of a junction between the second p-doped layer and the at least one of the n-doped epilayer and the highly n$^+$-doped silicon substrate (a) is lower than a breakdown voltage between the first p-doped layer and the n-doped epilayer and (b) thereby forms the breakdown voltage of the pseudo-Schottky diode; and
      the gate, the body regions, and the source are monolithically and electrically connected to one another.

18. The circuit as recited in claim 17, wherein the circuit allows for a high reverse voltage above the breakdown voltage of the pseudo-Schottky diode to occur, in response to which high reverse voltage, the diode is structured such that:
   the junction between the second p-doped layer and the at least one of the n-doped epilayer and the highly n$^+$-doped silicon substrate responsively breaks down; and
   no charge carrier injection can occur into the first p-doped layer without passing into the second p-doped layer.

19. The circuit as recited in claim 17, wherein the circuit allows for a high reverse voltage above the breakdown voltage of the pseudo-Schottky diode to occur, in response to which high reverse voltage, the diode is structured such that:
   the junction between the second p-doped layer and the at least one of the n-doped epilayer and the highly n$^+$-doped silicon substrate breaks down;
   no resulting charge carrier injection can occur into the first p-doped layer without passing into the second p-doped layer; and
   no resulting charge carrier injection can occur through any dielectric layer in the at least one trench.

20. The circuit as recited in claim 17, wherein the pseudo-Schottky diode is a component of a motor vehicle generator of the circuit.

21. The circuit as recited in claim 17, wherein the pseudo-Schottky diode is a component of a motor vehicle alternating current generator of the circuit having more than three phases.

* * * * *